(12) United States Patent
Iorio

(10) Patent No.: US 8,392,489 B2
(45) Date of Patent: *Mar. 5, 2013

(54) ASCII TO BINARY FLOATING POINT CONVERSION OF DECIMAL REAL NUMBERS ON A VECTOR PROCESSOR

(75) Inventor: Francesco Iorio, Dublin (IE)

(73) Assignee: International Business Machines Corporation, Armonk, NY (US)

( * ) Notice: Subject to any disclaimer, the term of this patent is extended or adjusted under 35 U.S.C. 154(b) by 1420 days.

This patent is subject to a terminal disclaimer.

(21) Appl. No.: 12/031,706

(22) Filed: Feb. 15, 2008

(65) Prior Publication Data

US 2009/0210467 A1 Aug. 20, 2009

(51) Int. Cl.
G06F 7/00 (2006.01)
G06F 15/00 (2006.01)
(52) U.S. Cl. ...................................... 708/204
(58) Field of Classification Search .................. 708/204
See application file for complete search history.

(56) References Cited

U.S. PATENT DOCUMENTS

| | | | |
|---|---|---|---|
| 3,872,442 A | 3/1975 | Boles et al. | |
| 4,068,298 A * | 1/1978 | Dechant et al. | 1/1 |
| 4,437,156 A * | 3/1984 | Christopher et al. | 708/139 |
| 5,796,641 A | 8/1998 | Tu | |
| 6,182,104 B1 | 1/2001 | Buss et al. | |
| 6,658,625 B1 | 12/2003 | Allen | |
| 6,842,850 B2 | 1/2005 | Ganapathy et al. | |
| 7,216,138 B2 | 5/2007 | Abdallah et al. | |
| 7,219,336 B2 | 5/2007 | Etzion et al. | |
| 2005/0172290 A1 | 8/2005 | Klingman | |
| 2007/0203965 A1* | 8/2007 | Reynolds | 708/200 |
| 2009/0172349 A1* | 7/2009 | Sprangle et al. | 712/4 |

OTHER PUBLICATIONS

Prince, Double to (and from) string conversion, C Users, Abstract Journal, Jul. 1991, p. 75 (12), v9, n7.

* cited by examiner

*Primary Examiner* — Chat Do
*Assistant Examiner* — Kevin G Hughes
(74) *Attorney, Agent, or Firm* — PRTSI, Inc.; Martin D. Moynihan

(57) ABSTRACT

A system, method, and apparatus for converting a decimal real number in ASCII format to a decimal real number in floating point binary decimal format in a vector processor are described. The method results in the performance of the conversion in a branchless manner and in a constant-time regardless of the size of the ASCII string, within a given range of sizes provided for by the vector processor architecture. The method may take advantage of the single instruction multiple data (SIMD) feature of the vector processor, although it is not restricted to a single instruction.

1 Claim, 1 Drawing Sheet

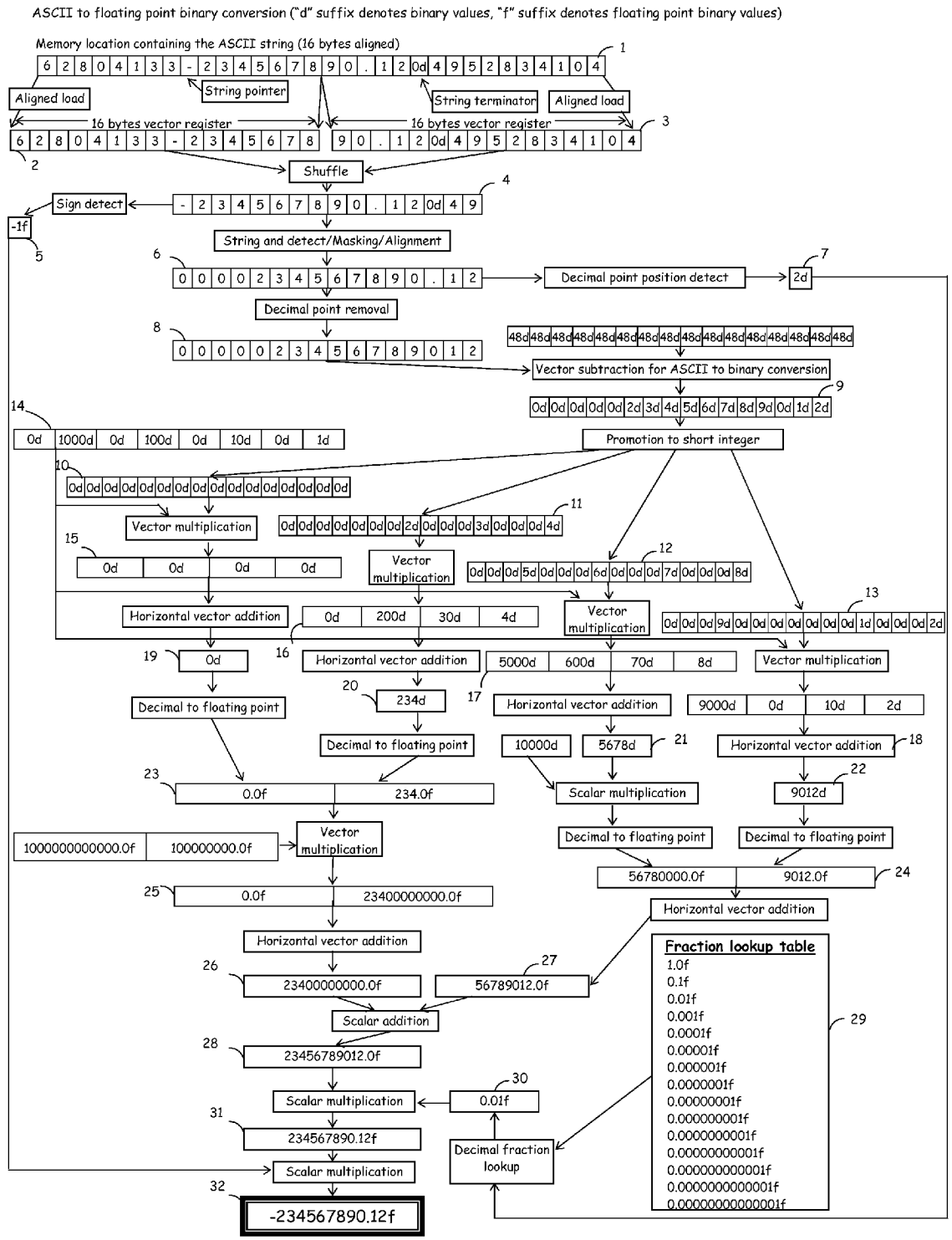

ASCII TO BINARY FLOATING POINT CONVERSION OF DECIMAL REAL NUMBERS ON A VECTOR PROCESSOR

SCOPE

The present invention relates to the conversion of numerical data in a vector processor.

BACKGROUND

American Standard Code for Information Interchange (ASCII) to binary floating point format conversion of decimal real numbers is a common task for applications such as financial-services-trading data processing. Commodity microprocessors tackle this problem by iterating over the individual digits of the real number and accumulate the partial result until a decimal point delimiter character or a string delimiter character is found, which ends the process. Because numbers, when expressed in ASCII format, can assume arbitrary length, the traditional algorithms solve the problem in a time directly proportional to the length of the string representing the number, and the generated code contains several branches, which can cause severe latency penalties on several modern processing architectures.

Methods for conversion of a real number from ASCII to binary floating point within a processor are known. These methods include identifying the beginning, ending, sign, and decimal point position of the real number in the ASCII string, extracting the decimal point, followed by taking each of the seven bit components of the ASCII real number, one character at a time, and subtracting the binary number, forty eight, to get the decimal numbers that make up the real number. Then, each of the decimal components of the real number is multiplied by a power of ten, starting with ten to the zero power, or one, for the least significant digit, ten to the first power, or ten, for the digit to the left of the least significant digit, if applicable, ten to the second power, or one hundred, for the digit to the left of the previous digit, if applicable, etc. This is repeated for as many digits comprising the real number, up to and including the most significant digit. Each of these products is then accumulated and the sign added, resulting in a binary decimal converted number. To process this number into a floating point format, the position, identified above, for the decimal point is shifted to the left until only one non-zero digit remains to the left of the decimal point position. This is called normalization. Corresponding to this shift, the number of shifted positions is noted so that the resulting number of one non-zero digit followed by the decimal point, followed by the fraction may be multiplied by the radix raised to the power of the number of decimal point shifts. The final floating point representation is the sign, the real number or the mantissa, and the fraction, or exponent.

One problem with this technique is that, since it is iterative, the time for conversion will vary, becoming longer as the size of the ASCII real number string increases. Another problem is that code for performing the conversion function involves branching and the use of multiple instructions, also adding to the execution time and efficiency of the conversion, due to latency issues.

SUMMARY

To overcome the problems presented above, the invention provides a system, code, and an algorithmic method with the objective to perform branchless constant-time format conversion by exploiting the parallel processing nature of the modern single instruction multiple data instruction, SIMD, vector processing architectures. The advantage is a substantially higher predictability of the execution time, and higher overall performance on modem vector processors which poorly tolerate intense program flow control. The additional predictability and performance make the method more suitable than traditional ones in high performance data processing applications and in soft real-time systems based on vector processors.

It is a further object of this invention to provide a vector processor architecture, selection of code, and a method for converting a signed ASCII real number of any size to a signed, floating point, binary decimal real number in a vector processor wherein the conversion time will be constant regardless of the size of the ASCII real number within a given range of sizes provided for by the vector processor architecture.

To achieve these objectives, the system uses code which, when executed, implements one or more steps of an algorithmic method to perform branchless constant-time conversion of an ASCII string real number, said real number comprising a sign byte, an integer part, a fractional part, a decimal point separating the integer part from the fractional part, and a string terminator, to a binary decimal floating point real number representation on a vector processor. The code comprises a fixed sequence of a constant number of instructions.

Included in the algorithmic method is detection of the sign byte and assignment of a unique binary value to said sign byte depending on the sign being positive or negative. Also included is the parallel detection of the string terminator and masking of all unused characters as well as parallel detection of the decimal point that separates the integer part of the number from the fractional part of the number.

Subsequent steps include, parallel conversion of all characters of the string into corresponding binary decimal values, parallel multiplication of each of the binary decimal values with a power of ten corresponding to the placement of each of the binary decimal values inside the decimal number to obtain individual binary results, an aggregation of the individual binary results of the parallel multiplication into a first intermediate binary result, multiplication of the first intermediate binary result with a floating point power of ten corresponding to a placement of the decimal point to obtain a second intermediate binary result, and multiplication of the second intermediate binary result with the binary value assigned to the sign to get a final floating point binary decimal result.

To achieve the objective of a constant time conversion, the vector processor architecture and code are designed such that, when executed, the code breaks the real number up into two or more sections and loads each section into one or more fixed size registers from which the operations of conversion including subtracting binary forty eight from each of the ASCII real number's digits and multiplying by the appropriate power of ten are done in parallel.

While the invention does not impose, upon the method, code, or architecture, the use of single instruction, it is yet a further objective of the invention to provide a vector processor capable of the conversion using a single instruction.

To achieve this further objective of providing a vector processor capable of performing the conversion with a single instruction, the inherent single instruction multiple data instruction, SIMD, capability of the vector processor is used in combination with code designed with the SIMD function in the design of the vector processor.

DESCRIPTION OF DRAWINGS

FIG. 1. A flow of an ASCII to Floating point binary decimal real number conversion in a vector processor.

DETAILED DESCRIPTION OF THE INVENTION

FIG. 1 represents a flow of a preferred embodiment of the invention. It shows steps and registers involved in a branchless, constant time execution of an ASCII real number to floating point binary decimal conversion within the vector processor. The ASCII real number value can be any value equal to, less than or greater than zero and comprising any number of digits, with an integer, a fractional part, and a decimal point between the integer and the fractional part.

In the example of FIG. 1, the real number is less than zero, therefore a negative number, whose absolute value is 234567890.12. Thus the number in the example is comprised of a minus sign, an integer, 234567890, comprising nine digits, a fractional part, 12, consisting of two digits, and a decimal point between the integer and the fractional part. FIG. 1 illustrates the operational steps, results, and registers used in the example.

In step 1, the first of a fixed number of sequential instructions is executed for the ASCII to floating point binary decimal conversion and the ASCII number is fetched from memory. In this embodiment the real number is contained in a 32-byte word, 1, and is not on a word boundary. The real number is detected as being between the sign bit and the string terminator.

In step 2, the loaded word's first byte is aligned with the first byte of a first 16-byte vector register, 2, and the word's last byte is aligned with the last byte of a second 16 byte vector register, 3, such that part of the ASCII string is in the first register, 2, and part is in the second register, 3.

In step 3, the contents of the first and second registers, 2 and 3, are shuffled into a third 16-byte register, 4, such that the left most byte contains the sign and the following bytes to the right contain the real number digits, including the decimal point and the string terminator.

In step 4, the sign is detected, stripped from the word, and a binary representation of the sign polarity is stored in a one-byte register, 5.

In step 5, the string terminator is detected, and the remaining digits of the real number are shifted to a right justified aligned position as shown in 6. The unused leading characters are masked as zeros.

In step 6, the number of positions to the right of the decimal point are detected and stored in a one-byte register, 7. Then the decimal point is stripped, while the integer is shifted one position to the right and a leading zero is inserted in the leftmost position as shown in 8 to form an eleven digit real number with no decimal point.

In step 7, binary decimal forty eight is subtracted from each character of the word in the register of step 6 to perform the ASCII to binary decimal conversion of each digit of the real number.

In step 8, the now eleven-byte real number word is divided into four four-byte pieces and promoted to four short integer words of sixteen bytes each as shown in 10, 11, 12, and 13.

In steps 9a through 9d, each of the short integer words is vector multiplied by an eight byte word, 14, consisting of alternate binary decimal zeros and appropriate powers of ten such that four four-byte binary decimal words, 15, 16, 17, and 18 result.

In step 10, the contents of each of the four-byte binary decimal words, 15, 16, 17, and 18 result are horizontally added, resulting in four decimal numbers, 19, 20, 21, and 22.

In step 11, the resulting numbers, 19, 20, and 22 are converted to a floating point number by placing a decimal point, followed by a zero, to the right of the last number of each. The floating point conversion results, from numbers in 19 and 20, are placed adjacent each other in word, 23. The remaining resulting number, 21, is first scalar multiplied by ten to the power of four, or decimal 10,000, before it is converted to floating point by placing a decimal point, followed by a zero, to the right of the last number. This result, along with the floating point conversion from 22, are placed adjacent one another in word 24.

In step 12, the left, half word in 23 is vector multiplied by ten to the power of twelve, represented in floating point as 1000000000000.0f and the right, half word of 23 is vector multiplied by ten to the power of eight, represented in floating point as 100000000.0f to form two new adjacent half words as shown in 25.

In step 13, a horizontal vector addition is performed on the two adjacent half words in 25 and the two adjacent half words in 24 with the results placed in 26 and 27 respectively.

In step 14, a scalar addition is performed on the results in 26 and 27 with the result placed in 28.

In step 15, the number of positions to the right of the decimal in the original ASCII string real number, which was obtained in step 6 and stored in 7, is used in conjunction with a fraction look up table, 29, to obtain a negative power of ten, in this example, ten to the minus two, represented as floating point 0.01f as shown in 30.

In step 16, a scalar multiplication of the result in 28, from step 14, by the floating point number in 30 is performed and the result placed in 31.

In step 17, a scalar multiplication of result in 31, by the binary representation of the sign polarity, obtained from step 4 and stored in register 5, is performed with the final floating point representation of the ASCII string real number placed in 32.

While the embodiment of FIG. 1 shows an example of the execution of the floating point conversion in a vector processor using an ASCII string comprising a sign, a 9-digit integer part, a decimal point, a 2-digit fractional part, and a string terminator, the processor architecture and code can be adjusted to support any size string comprising a larger number of digits, by the hierarchical combination of the same process over multiple sections of the ASCII string, still giving a constant, albeit longer, time of conversion.

As stated above, the ASCII string real number size may vary from 1 digit to any number of digits up to a predetermined design maximum number of digits, but through the application of the parallel arithmetic means and operations, the proper selection of code, and by designing the number and lengths of the registers and/or the word sizes, the execution time of the conversion will remain constant for any string size within the design range and the conversion will be achieved without branching.

While the embodiment of FIG. 1 shows a preferred execution of the real number format conversion in a vector processor, the conversion need not be performed in the exact number nor sequence of steps shown as long as the application of parallel arithmetic operations and one or more sets of constant number of instructions of fixed sequences are used to reduce the execution time and increase the efficiency of the conversion.

What is claimed:

1. An algorithmic method to perform branchless constant-time conversion of an ASCII string real number of any byte size equal to or less than the byte size of the registers provided for by a vector processing architecture, said real number comprising a sign byte, an integer part, a fractional part, a decimal point separating the integer part from the fractional part, and a string terminator, to a binary floating point real number representation of the ASCII string real number on a vector processor having the vector processing architecture, said binary floating point real number representation of the ASCII string real number comprising a positive or negative binary vector value, corresponding to a positive or negative sign byte, respectively of the ASCII string real number and having a magnitude with an integer portion and a fractional portion with a decimal point separating the integer portion from the fractional portion, said method comprising, implementation of code comprising a fixed sequence of a constant number of instructions to execute one or more steps of the conversion, said conversion further comprising, detection of the sign byte, assigning a plus or minus 1 value, dependent on the sign being positive or negative respectively, storing this value in a register of the vector processor, and removing the sign byte from the ASCII string real number; detection of the string terminator, aligning the string to an edge of a vector processor register having byte width equal to or greater than the number of characters in the ASCII string real number and, if the register has a greater byte width than the number of characters in the ASCII string real number, masking all unused characters in from the opposite edge to the aligned edge with zeros resulting in one or more leading or trailing zeros; detecting and storing in a register of the vector processor the decimal point position that separates the integer part of the ASCII string real number from the fractional part of the ASCII string real number and removal of the decimal point from the ASCII string real number; parallel conversion of all one or more characters of the unsigned string, with no decimal point, into corresponding binary coded decimal bytes to form a binary real number having one or more bytes, wherein the number of the one or more bytes corresponds to the number of characters of the unsigned string with no decimal point; parallel multiplication of each of the binary coded decimal values with a power of ten corresponding to the placement of each of the binary coded decimal values inside the binary real number to obtain individual binary results; aggregation of the individual binary results of the parallel multiplication into a first intermediate binary result; multiplication of the first intermediate binary result with a floating point power of ten corresponding to a placement of the decimal point to obtain a second intermediate binary result; and multiplication of the second intermediate binary result with the binary value assigned to the sign to get a final signed floating point binary result.

* * * * *